United States Patent
Mizugaki et al.

[11] Patent Number: 6,146,456
[45] Date of Patent: Nov. 14, 2000

[54] METHOD FOR ANNEALING SINGLE CRYSTAL FLUORIDE AND METHOD FOR MANUFACTURING THE SAME

[75] Inventors: Tsutomu Mizugaki, Matsudo; Shuuichi Takano, Inagi, both of Japan

[73] Assignee: Nikon Corporation, Tokyo, Japan

[21] Appl. No.: 09/135,016

[22] Filed: Aug. 17, 1998

[30] Foreign Application Priority Data

Jul. 16, 1998 [JP] Japan .................................. 10-202072

[51] Int. Cl.[7] ............................ C30B 29/12; C30B 33/02
[52] U.S. Cl. ...................... 117/2; 117/3; 117/73; 117/76; 117/940
[58] Field of Search .................................. 117/3, 73, 76, 117/83, 906, 940, 2; 23/304, 305 RE; 252/301.4 H, 301.4 R; 423/263

[56] References Cited

U.S. PATENT DOCUMENTS 3,649,552 3/1972 Robinson et al. .............. 252/301.4 H
5,290,730 3/1994 McFarlane et al. ...................... 438/23
5,394,420 2/1995 Senn et al. ................................ 372/39

FOREIGN PATENT DOCUMENTS 409315894A 12/1997 Japan .

Primary Examiner—Benjamin L. Utech
Assistant Examiner—Donald L. Champagne
Attorney, Agent, or Firm—Morgan, Lewis & Bockius LLP

[57] ABSTRACT

An annealing method for a single crystal of fluoride is provided. The method includes the steps of removing at least one of attached objects and absorbed objects from the surface of the single crystal of fluoride to clean the surface, thereafter annealing the single crystal of fluoride, including heating the single crystal of fluoride and gradually cooling the heated single crystal of fluoride, and removing a deteriorated layer which is formed on the surface of the single crystal of fluoride during the annealing step.

28 Claims, 2 Drawing Sheets

METHOD FOR ANNEALING SINGLE CRYSTAL FLUORIDE AND METHOD FOR MANUFACTURING THE SAME

This application claims the benefit of Japanese Application No. 10-202072, filed in Japan on Jul. 16, 1998, which is hereby incorporated by reference.

BACKGROUND OF THE INVENTION

1. Field of the Invention

The present invention relates to a method for annealing a single crystal of fluoride and a method for manufacturing a single crystal of fluoride. The single crystal of fluoride processed by the methods of annealing and manufacturing is suitable for use in lenses, prisms, and the like for an optical system of an excimer laser stepper, which requires a high precision image formation capability. More specifically, the present invention relates to a method of annealing and manufacturing a single crystal of fluoride whereby it is possible to obtain a single crystal of calcium fluoride, etc., which is appropriate for use in an optical system, such as a lens or window material, for various devices that utilize a laser in the ultraviolet wavelength range or the vacuum ultraviolet wavelength range, such as a stepper, CVD apparatus, or nuclear fusion apparatus. Also, the present invention is suitable for an optical system for photolithography with wavelengths of 250 nm or less (photolithography utilizing KrF or ArF excimer lasers, $F_2$ lasers, solid-state lasers with non-linear optical crystals, etc.).

2. Discussion of the Related Art

In recent years, due to the progress towards higher levels of integration and higher complication in the functions of VLSI, micro-level processing technology on a wafer has increasingly been required. An exposure apparatus called a stepper, which exposes and transcribes the minute pattern of an integrated circuit onto a wafer made of silicon, etc., has been used in photolithography.

For the projection lens of a stepper, which is the key to photolithographic technology, superior image forming capabilities (resolution, focal depth) are required. The resolution and focal depth are determined by the wavelength of exposing light and the numerical aperture (NA) of the lens. For a fixed exposure wavelength, as the pattern becomes finer, the angle of the diffracted ray becomes greater. Therefore, if the NA of the lens is not sufficiently large, the diffracted rays cannot be collected to produce high resolution. If the exposure wavelength becomes shorter, the angle of the diffracted rays becomes smaller for the same pattern and, therefore, it would be acceptable to have a small NA for the lens.

The resolution and the focal depth are expressed by the following equations:

$$\text{Resolution} = k_1 \cdot \lambda / NA$$

$$\text{Focal depth} = k_2 \cdot \lambda / (NA)^2,$$

where k1 and k2 are proportional constants.

These equations imply that in order to improve the resolution, the NA of the lens (diameter of the lens) should be enlarged, or the exposure wavelength should be shortened. In addition, in terms of the focal depth, it is advantageous to shorten $\lambda$.

Recently, the wavelength of the exposure light ray has been becoming shorter and shorter. For example, steppers using KrF excimer lasers (wavelength of 248 nm) have already appeared on the market. There are very few optical materials that can be used in photolithography for light having a wavelength of 250 nm or less. Usually, single crystals of calcium fluoride and silica glass are used.

As for enlarging the diameter of the lens, simply having a large diameter (approximately a diameter of 150 mm to 250 mm) is not sufficient, and a superior homogeneity is required in the refractive index of single crystals of calcium fluoride (fluorite) and silica glass.

The single crystal growth of calcium fluoride has conventionally been conducted with a method called the Bridgeman method (Stockbarger, crucible lowering method). For a single crystal of calcium fluoride (fluorite) for small-sized optical parts and for window materials that do not require stringent homogeneity, the final products are obtained through finishing processes, such as rounding, after the ingot obtained from the crystal growth is cut out.

In contrast, for single crystals of calcium fluoride which require high homogeneity, such as those for use in optical systems (projection lens, for example) for a stepper, a simple annealing is first applied to the ingot and an additional annealing is conducted after an appropriate size of calcium fluoride is cut out from the ingot to produce the intended product. These anneals are necessary because the ingot has high residual stress and strain, as it is.

Because a single crystal of calcium fluoride reacts with oxygen at a temperature of 700° C. or more, the annealing is conducted in an oxygen-free atmosphere. During this annealing process, the object to be annealed is enclosed in a container (container for enclosing the annealed product) made of materials such as carbon, which have a low reactivity at this temperature range, for example. Then, the entire container is enclosed in an airtight container which can be vacuumed.

By providing insulation from the external atmosphere with the airtight container, the annealing of the single crystal of calcium fluoride is conducted with an appropriate temperature schedule (control).

However, with the conventional annealing method, a haze may be generated inside the calcium fluoride upon annealing of the single crystal of calcium fluoride. As a result, the desired high transmittance cannot be obtained in such a case.

In addition, there has been the problem that by using the conventional annealing apparatus or annealing method for the annealing of a single crystal of calcium fluoride that is cut out into an appropriate size, it is impossible to obtain a single crystal of calcium fluoride with a satisfactory small strain (birefringence) (low strain within an acceptable range), which can be used for precision optical systems, such as excimer laser steppers.

Moreover, due to the enlargement of the diameter and the increase in mass of the single crystal of fluoride as an optical member, the problem in removing strain/birefringence (reduction of strain/birefringence) is becoming more and more difficult.

SUMMARY OF THE INVENTION

Accordingly, the present invention is directed to a method for annealing a single crystal of fluoride and a method for manufacturing the same that substantially obviate the problems due to limitations and disadvantages of the related art.

An object of the present invention is to provide annealing and manufacturing methods for a single crystal of fluoride which is appropriate for optical systems, such as lens and window material, for various apparatus that utilize lasers in the ultraviolet or vacuum ultraviolet wavelength range, CVD apparatus, and nuclear fusion apparatus. Such a single crystal of fluoride is appropriate for high precision optical systems for photolithography with wavelengths of 250 nm or less (for example, photolithography that utilizes KrF or ArF excimer lasers, $F_2$ lasers or solid-state lasers with non-linear optical crystals).

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides an annealing method for a single crystal of fluoride, the method including the steps of removing at least one of attached objects and absorbed objects from the surface of the single crystal of fluoride to clean the surface; and thereafter annealing the single crystal of fluoride, including heating the single crystal of fluoride and gradually cooling the heated single crystal of fluoride.

In another aspect, the present invention provides an annealing method for a single crystal of fluoride, the method including the steps of annealing the single crystal of fluoride, including heating the single crystal of fluoride and gradually cooling the heated single crystal of fluoride; and removing a deteriorated layer which is formed on the surface of the single crystal of fluoride during the annealing step.

In another aspect, the present invention provides an annealing method for a single crystal of fluoride, the method including the steps of removing at least one of attached objects and absorbed objects from the surface of the single crystal of fluoride to clean the surface; thereafter annealing the single crystal of fluoride, including heating the single crystal of fluoride and gradually cooling the heated single crystal of fluoride; and removing a deteriorated layer which is formed on the surface of the single crystal of fluoride during the annealing step.

In another aspect, the present invention provides a manufacturing method of a high quality single crystal of fluoride, the method including the steps of growing a single crystal of fluoride by fusing a fluoride material in a crucible and gradually cooling the fused fluoride material; removing at least one of attached objects and absorbed objects from the surface of the single crystal of fluoride to clean the surface; and thereafter annealing the single crystal of fluoride, including heating the single crystal of fluoride and gradually cooling the heated single crystal of fluoride.

In another aspect, the present invention provides a manufacturing method of a high quality single crystal of fluoride, the method including the steps of growing a single crystal of fluoride by fusing a fluoride material in a crucible and gradually cooling the fused fluoride material; annealing the single crystal of fluoride, including heating the single crystal of fluoride and gradually cooling the heated single crystal of fluoride; and removing a deteriorated layer which is formed on the surface of the single crystal of fluoride during the annealing step.

In a further aspect, the present invention provides a manufacturing method of a high quality single crystal of fluoride, the method including the steps of growing a single crystal of fluoride by fusing a fluoride material in a crucible and gradually cooling the fused fluoride material; removing at least one of attached objects and absorbed objects from the surface of the single crystal of fluoride to clean the surface; thereafter annealing the single crystal of fluoride, including heating the single crystal of fluoride and gradually cooling the heated single crystal of fluoride; and removing a deteriorated layer which is formed on the surface of the single crystal of fluoride during the annealing step.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTIONS OF THE INVENTION AND THE PREFERRED EMBODIMENTS

Figure 1:
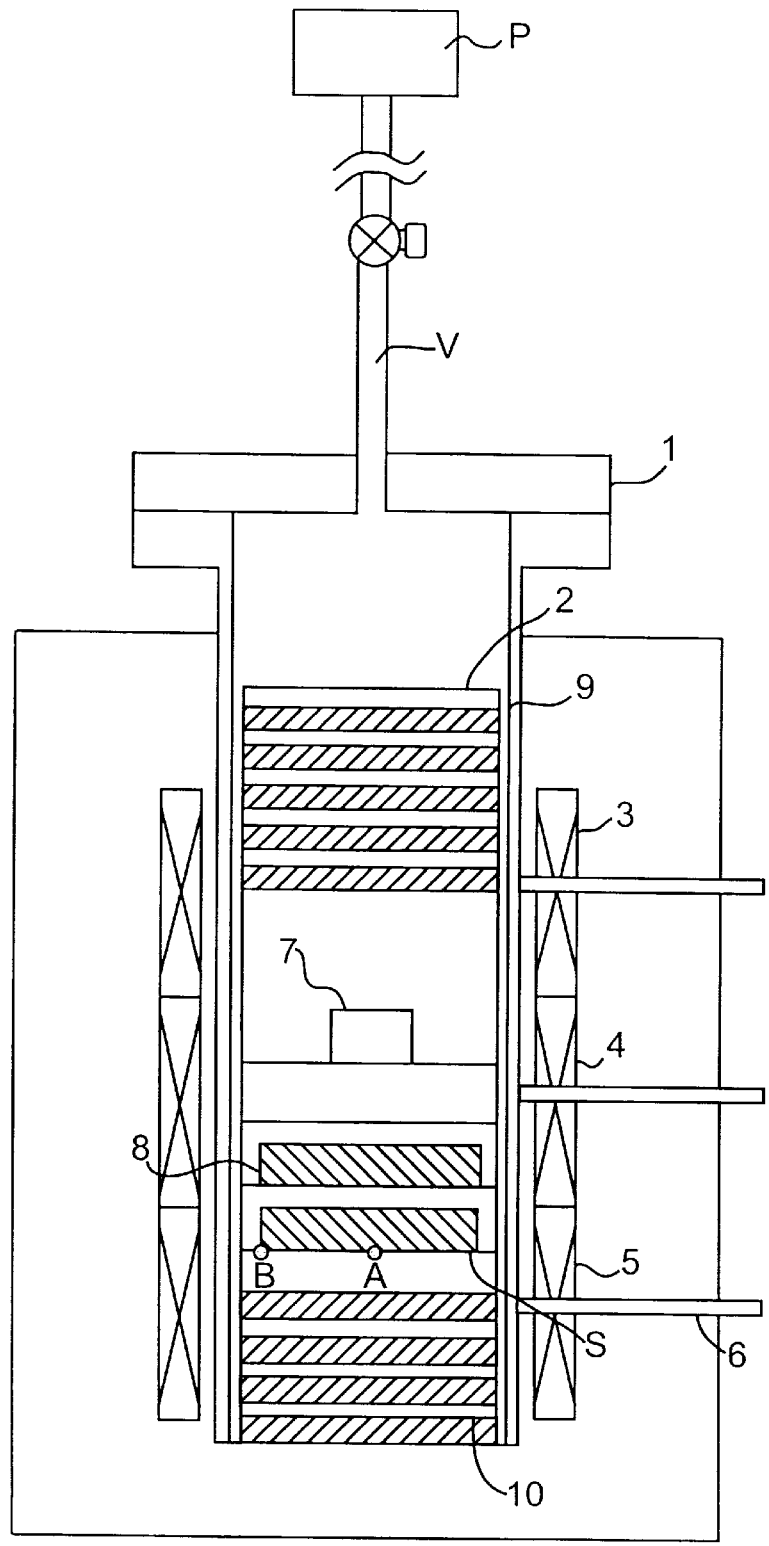
FIG. 1 is a schematic cross-sectional view of an annealing apparatus according to a preferred embodiment of the present invention.

The inventors of the present invention have discovered that the causes of the haze generated inside the single crystal of fluoride upon annealing are foreign objects, impurities, moisture, and oxygen components that are attached to or absorbed in the surface of the object annealed. Therefore, in the present invention, a process for cleaning the surface of the single crystal of fluoride is conducted prior to the annealing. In other words, the present invention provides an annealing method for a single crystal of fluoride, including the cleaning steps of cleaning the surface to remove attached or absorbed objects on the surface of the single crystal of fluoride and the annealing step of annealing the single crystal of fluoride such that after the single crystal of fluoride, from which the absorbed or attached objects are removed, is placed under heat, the single crystal is gradually cooled.

Furthermore, the inventors of the present invention have discovered that even for a single crystal of fluoride that went through the cleaning process, its surface is etched due to the heat and the existence of a fluorination agent during the annealing. The deteriorated layer due to this etching may deteriorate the quality of the single crystal of fluoride.

In the present invention, a deteriorated layer removal process is provided to remove the deteriorated layer formed on the single crystal of fluoride after the annealing. In other words, the present invention provides an annealing method for annealing a single crystal of fluoride, including an annealing process including gradually cooling the single crystal of fluoride after maintaining under heat the single crystal of fluoride and a deteriorated layer removal process for removing the deteriorated layer formed on the surface of the single crystal of fluoride due to the annealing.

Even if only one of the surface cleaning process before annealing or the deteriorated layer removal process after the annealing is carried out, it is possible to effectively maintain the high transmittance of the resultant single crystal of fluoride. However, since the mechanism to maintain the high transmittance (namely to prevent the reduction of transmittance) for each process is different, even better results can be obtained by carrying out both processes.

Next, the present inventors investigated the strain (birefringence) generated due to annealing, and found that a key is whether the entire single crystal of fluoride can be uniformly heated and cooled by maintaining the desired temperature distribution inside the furnace of the annealing apparatus (annealing chamber) used for the annealing of the single crystal of fluoride.

In addition, a single crystal of calcium fluoride with satisfactory strain characteristics that is acceptable for use in high-precision optical systems, such as for excimer laser steppers, was successfully obtained by having a narrow distribution of the internal temperature in the single crystal of fluoride during the annealing process, specifically, by controlling the distribution range (fluctuation) of the internal temperature to be within about 5° C. or less. Thus, in another aspect, the present invention provides an annealing method for a single crystal of fluoride wherein the distribution range (fluctuation) of the internal temperature of the single crystal of fluoride is always controlled to be within 5° C. or less.

Furthermore, in still another aspect, the present invention provides a manufacturing method for a single crystal of fluoride using the above-mentioned annealing method. In other words, the manufacturing method of a single crystal of fluoride according to the present invention includes a crystal growth step in which after the fluoride material is fused in a crucible for crystal growth, a single crystal of fluoride is grown by gradually cooling it, and an annealing step in which after the single crystal of fluoride is maintained under heat, it is gradually cooled. In addition, the method further includes a surface cleaning step for removing absorbed or attached objects on the surface of the single crystal of fluoride before the annealing process, and/or a deteriorated layer removal step for removing a deteriorated layer formed on the surface of the single crystal of fluoride due to the annealing process after the annealing process.

Reference will now be made in detail to the preferred embodiments of the present invention, examples of which are illustrated in the accompanying drawings.

In a first aspect of the present invention, the annealing method of the present invention includes a cleaning process for removing foreign objects, impurities, moisture, or oxygen absorbed or attached on the surface of the single crystal of fluoride which is to be annealed. With this annealing method of the present invention, foreign objects, impurities, moisture, or oxygen components, which cause the reduction of the transmittance and increase scattering (generation of haze) in a single crystal of fluoride to be annealed during the annealing, are removed from the surface of the single crystal of fluoride before the annealing process. Therefore, it is possible to obtain extremely high quality single crystals of fluoride with high transmittance without haze or scattering.

The foreign objects and impurities can be removed by ultrasonic cleaning or scrub cleaning using detergents (anionic, cationic, or neutral detergent), organic solvents, acids, alkali, or the like, or by using a cleaning treatment with ultraviolet light or ozone. Also, for the visibly recognizable impurities, it is possible to remove such impurities by rubbing the single crystal of calcium fluoride with another crystal of calcium fluoride.

It is possible to remove moisture and oxygen components by vacuuming and heating (approximately to several hundred degrees) using vacuum apparatus. In order to remove the oxygen component or moisture from the container more thoroughly, it is desirable to, after carrying out the vacuuming process once, introduce an inert gas into the container and then carry out the vacuuming process again.

In a second aspect of the present invention, the annealing method includes, after carrying out the annealing, a deteriorated layer removal process for removing a deteriorated layer formed on the single crystal of fluoride. In general, during the annealing of a single crystal of fluoride, a fluorination agent, such as Teflon or an acidic ammonium fluoride, is enclosed in the container together with the single crystal of fluoride. When annealing is carried out under this condition, the surface or surface layer of the single crystal of fluoride is damaged by being etched by heat and the fluorination agent. This damage due to the etching causes a reduction of the transmittance of the single crystal of fluoride. Therefore, in the annealing method of the present invention, the deteriorated layer generated by the etching is removed by grinding, for example. The deteriorated layer is a few millimeters or less with regular annealing. Therefore, the acceptable thickness of the layer to be removed is approximately 0.1 to 1.5 mm, for example.

As described above, the annealing method of the present invention can provide a high-quality single crystal of fluoride with high transmittance and with very little haze and light scattering.

It is desirable for the annealing of the present invention to be carried out in an oxygen-free atmosphere (vacuum atmosphere, inert gas atmosphere, fluorine gas atmosphere, etc.) in order to prevent oxidation of the single crystal of fluoride. In addition, when the durability of the airtight container is taken into account, it is desirable that the above-mentioned oxygen-free atmosphere be an inert gas atmosphere or a fluorine gas atmosphere and that the pressure thereof in the container be equal to (or approximately equal to) the atmospheric pressure outside the container.

Moreover, in the annealing method of the present invention, in order to obtain a single crystal of fluoride with little strain (birefringence), it is desirable to control the distribution range (fluctuation) of the internal temperature of the single crystal of fluoride during the annealing process to be always within about 5° C. or less.

The distribution of the internal temperature of the single crystal of fluoride during the annealing process may cause the generation of residual stress inside the single crystal of fluoride. Therefore, in the present invention, the distribution of the internal temperature of the single crystal of fluoride is controlled to be within a very narrow range by optimizing the temperature schedule, heaters, and other structures of the annealing apparatus during the annealing to be consistent with the single crystal of fluoride to be processed.

As described above, for the anneal carried out in order to obtain a single crystal of fluoride that is acceptable for use in a high-precision optical system, such as an optical system for photolithography with a wavelength of 250 nm or less (for example, photolithography using KrF or ArF excimer lasers, $F_2$ lasers, or solid-state lasers with non-linear optical crystals), it is essential that the entire single crystal of fluoride can be uniformly heated and cooled by maintaining the desirable temperature distribution range in the furnace of the annealing apparatus (annealing chamber) that is used.

Therefore, in the present invention, it is desirable to use the annealing apparatus which includes a container that can be made airtight where the single crystal of fluoride is enclosed and multiple heaters that can be individually controlled and arranged outside of the container.

The annealing apparatus that is used effectively in the present invention is described as follows. One of the features of the annealing apparatus of the present invention is to provide thermal insulation members inside the container, which prevent thermal transmission from the inside of the airtight container to the outside of the container. If the single crystal of fluoride is enclosed in an enclosure (enclosure for enclosing the annealed product), the thermal insulation members may also be enclosed in the enclosure enclosing the products to be annealed.

As described above, by providing thermal insulation members inside the airtight container it is possible to make the temperature distribution in the single crystal of fluoride more uniform by significantly reducing the temperature difference inside the airtight container. As a result, all the strains of the single crystal of fluoride subjected to annealing are removed or reduced from the single crystal of fluoride (in particular, a single crystal of fluoride with a large diameter), providing single crystal fluoride which can be used for the above-mentioned high-precision optical systems.

The thermal insulation members of the present invention can be arranged, for example, at locations inside the container where the amount of thermal transmission from the inside of the airtight container to the outside of the container are greater than the amount of thermal transmission from the outside of the container to the inside of the container. Alternatively, they can be arranged at other appropriate locations in the container enclosing the products to be annealed. Such locations include, for example, the places where it is extremely easy for heat inside the airtight container to escape to the outside of the container. Therefore, when thermal insulation members are arranged at these locations, it is possible to significantly reduce the temperature differences inside the container during the annealing.

Particularly, it is desirable for the members to be arranged at the locations where the heaters of the annealing apparatus are not arranged; for example, inside the airtight container corresponding to the top or bottom of the annealing apparatus.

Figure 2:
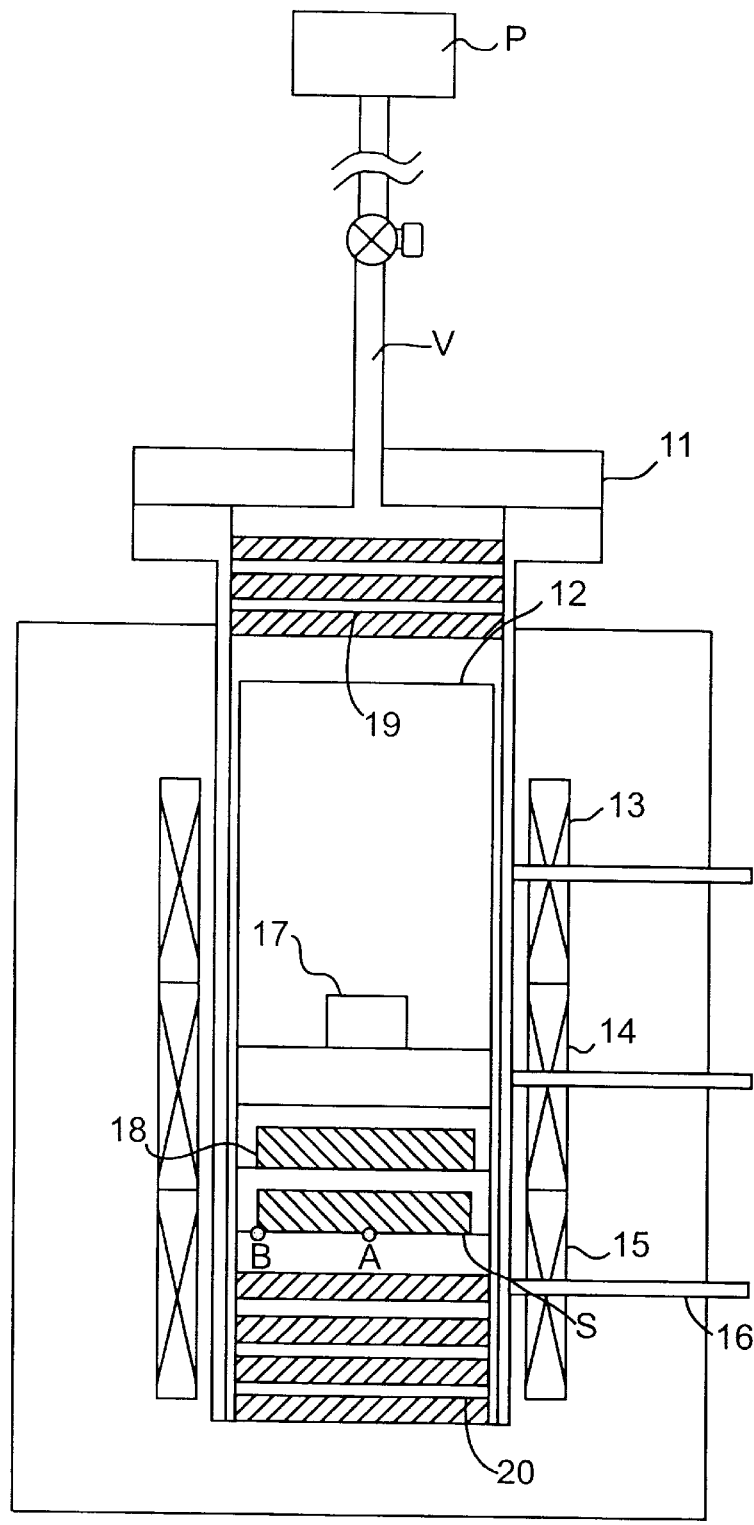
FIG. 2 is a schematic cross-sectional view of an annealing apparatus according to another preferred embodiment of the present invention.

A specific example for arrangement of the thermal insulation members is shown in FIG. 2. A plurality of plate-shaped members 19 and 20 are arranged at the top and bottom edges and at the inside of the container for the annealing apparatus and the heaters 13, 14 and 15 are arranged only on both outer side portions of container 11. There are no heaters on the outer top and bottom portions of the container 11.

In particular, the plurality of plate-shaped members 19 provided on the top portion of container 11 are adapted to be detachable when the annealing object is placed in or removed from the airtight container. Because it is difficult to arrange heaters on the top portion of container 11 due to the placing and removing operation of the annealing object and due to vacuuming operation through vacuum pump P, it is particularly effective to arrange thermal insulation members on this portion.

The plurality of plate-shaped members 19 and the plurality of plate-shaped members 20 provided on the bottom portion are plate-shaped members with each being arranged so as to cover the inner cross-section of the container as well as being arranged as isolation from each other.

Multiple plate-shaped members 19 provided on the top portion of container 11 do not seal the container 11. Therefore, even though they are covering the inner cross-section of the container, it is possible to have a passage inside the container for the vacuuming conducted by vacuum pump P through vacuuming pipe V.

Another example of the thermal insulation members are shown in FIG. 1. In FIG. 1, a plurality of plate-shaped members 9 and 10 are provided on the top and bottom portions of the inside of a first container 2 installed in an annealing apparatus. The annealing apparatus has heaters 3, 4, and 5 arranged on both side portions on the outside of a second container 1. No heater is provided on the top and bottom portions on the outside of the second container 1.

The plurality of plate-shaped members 9 and 10 each are arranged to cover the inner cross-section of the container 2, and each of them is arranged in isolation from each other. It is desirable that the thermal insulation members of the present invention be arranged in isolation from each other and each space between the members be structured with space and/or some medium having a lower thermal conductivity than the members. This structure further prevents the heat inside the airtight container from escaping to the outside of the container so that a greater uniformity of the temperature distribution can be achieved inside the container during the annealing.

Examples of the space that has a lower thermal conductivity than the plate-shaped members are a vacuumed space and a space filled with inert gas. Examples of the medium that has a lower thermal conductivity than the plate-shaped members are, in the case that the plate-shaped members are metal members, carbon, carbon felt, carbon powder, carbon particles, ceramic fibers (alumina fibers, zirconia fibers, etc.), fluoride crystals, and ceramics (BN, SiC, SiN, alumina, zirconia, etc.), which have the melting points substantially equal to or greater than the single crystal of fluoride.

Also, it is quite effective to arrange the thermal insulation members of the present invention at the locations where the heat transferring amount from the outside of the airtight container to the inside of the container is greater than the hear transferring amount from the inside of the container to the outside of the container. In this case, the thermal insulation members are preferably one or two or more plate-shaped members arranged next to or close to the single crystal of fluoride such that the surfaces of the members are parallel (or approximately parallel) to the direction along which the greatest heat transfer from the outside of the airtight container to the inside of the container occurs. With such a configuration, since the plate-shaped members are parallel (or approximately parallel) to the direction along which the greatest heat transfer into the above-mentioned container (or first container) occurs, the desired thermal flow into the container is hardly affected. Furthermore, the plate-shaped members are provided next to or close to the single crystal of fluoride. Therefore, the plate-shaped members prevent the escape of heat from the single crystal of fluoride that is the object of the annealing (in particular, the heat loss in the direction perpendicular to the direction along which the greatest heat transfer occurs). As a result, it is possible to achieve an even better uniform temperature distribution in the single crystal of fluoride to be annealed.

When more than one single crystal of fluoride is to be annealed at the same time, the annealing is carried out by placing each single crystal of fluoride on a plurality of shelves S arranged inside the container 1 or 2, as shown in FIG. 1 and FIG. 2. These shelves may be constructed of the plate-shaped members described above. When these shelves are not constructed of the plate-shaped members, the plate-shaped members and single crystals of fluoride can be placed on each shelf. In this case, it is desirable to provide supporting parts to form a space (space with a lower thermal conductivity than that of the shelves) between the shelves and plate-shaped members so that the temperature distribution in the single crystals of fluoride, which are the object to be annealed, can be made more uniform.

An example of the thermal insulation member that can be used in the present invention includes a member having a melting point equivalent to or higher than that of the single crystal of fluoride and having at least its surface made of a metal element or alloy that has an electrical resistance equivalent to or lower than that of titanium. It is preferable for the heating insulation member to have at least its surface made of such a metal element or alloy with a low electrical resistance because such a metal element or alloy has a superior heat ray (infrared) reflection property due to its plasma oscillation of the conduction electrons.

Examples of the metal elements or alloys that have such a low electrical resistance include titanium, molybdenum, chrome, cobalt, zirconium, tungsten, tantalum, niobium, nickel, platinum, vanadium, molybdenum, ruthenium, rhenium, rhodium, their alloys, and stainless steel.

Also, the thermal insulation member having not only a superior heat ray (infrared) reflection property but also a low thermal conductivity may be used in the present invention.

Such thermal insulation members with a low thermal conductivity may be constructed of carbon, fluoride crystals (fluorite, polycrystal of fluorite, fluorite with defects such as inclusions) or ceramics (BN, SiC, SiN, alumina, zirconia, etc.) that have a melting point equivalent to or higher than that of the single crystal of fluoride.

Moreover, a member filled with carbon felt, carbon powders, carbon particles, or ceramic fibers (alumina fibers, zirconia fibers, etc.), which have a melting point equivalent to or higher than that of the single crystal of fluoride, may be used as the thermal insulation member of the present invention having a low thermal conductivity.

A method for controlling the internal temperature distribution range in the single crystal of fluoride to be within about 5° C. or less during the annealing using the above-mentioned annealing apparatus is described next. For example, as shown in FIGS. 1 and 2, three (3) separate heaters, a top, middle, and bottom heaters, may be provided at both sides at the outside of the container 11 (or the second container for enclosing the annealed product) and the temperature of each heater is individually controlled.

A single crystal of fluoride, which is the object to be annealed, is placed in the annealing apparatus. Then, the distribution range of the internal temperature in the single crystal of fluoride can be controlled within about 5° C. or less by making the distribution of the internal temperature in the container 11 (or the second container 1) uniform. This is done by setting the heating temperatures of heaters 3 and 5, which are close to the top portion and the bottom portion of the container 11 (or the second container 1 for enclosing the annealed product), respectively, where heat losses are relatively large, to a temperature higher than that of the middle heater 4. Middle heater 4 is close to the center portion of the container 11 (or the second container 1) where heat flowing in is greater than the heat loss.

When more than one single crystal of fluoride is to be annealed at the same time, as described above, annealing is carried out by placing each single crystal of fluoride on one of the plurality of shelves arranged in the container 11 (or first container 2). When the number of single crystals of fluoride to be annealed at the same time is increased and the length of the container 11 (or the second container 1) becomes larger accordingly, it is preferable to increase the number of the separate heaters that can be individually controlled in accordance with the increase in the length of the container. In this way, it is easier to control the internal temperature distribution of the container 11 (or the second container 1) so as to keep the distribution range of the internal temperature of the single crystal of fluoride within about 5° C. or less.

Also, additional heater(s) may be provided at the bottom portion of the outside of the container 11 (or the second container 1). In this case, plate-shaped members 10 and 20 are not necessary.

As described above, when the distribution range of the internal temperature in the single crystal of fluoride is maintained to be within about 5° C. or less, it is possible to remove all the strains or to reduce the strains in the single crystal of fluoride which is object to be annealed.

By using the above-mentioned annealing apparatus, when annealing the single crystal of fluoride with the annealing method of the present invention, it is possible to obtain a single crystal of fluoride (in particular, a single crystal of fluoride with a large diameter) that is acceptable for use in a high-precision optical system, such as optical systems for photolithography with wavelengths of 250 nm or less (for example, photolithography using KrF or ArF excimer laser, F2 lasers or solid-state lasers with non-linear optical crystals).

In more detail, the annealing process in the annealing method and the manufacturing method for a single crystal of fluoride according to the present invention includes the following steps:

The step of holding the single crystal of fluoride, from which absorbed or attached objects are removed, in an airtight container of an annealing apparatus;

The step of vacuuming the inside of the airtight container until the inside of the airtight container reaches a predetermined vacuum level;

The step of heating the container that was vacuumed to a predetermined temperature;

The step of maintaining the predetermined temperature of the container for a predetermined period of time; and The step of gradually cooling the container that was maintained at the predetermined high temperature.

In the vacuuming step above, the predetermined vacuum level may be arbitrary. However, in general, vacuuming is carried out until the pressure reaches about $10^{-1}$ Pa to $10^{-5}$ Pa. Normally, a rotary pump is used to vacuum the container up to a pressure of about $10^{-1}$ Pa, and a diffusion pump is used to vacuum the container to a pressure of about $10^{-5}$ Pa.

The purpose of the vacuuming process is to remove moisture and oxygen components from the atmosphere. It is also possible to introduce an inert gas after these components have been removed by the vacuuming. In addition, in order to remove the oxygen component and moisture from the container more thoroughly, it is preferable to perform an additional vacuuming process after an inert gas is introduced into the container following the first vacuuming process.

The heating speed of the heating process may be arbitrary. This is because fluctuation of the internal temperature in the single crystal of fluoride during this process has little effect on generation of strains (birefringence) in the resultant single crystal of fluoride. Therefore, it is not necessary to maintain the temperature distribution within about 5° C. or less, and heating can be carried out at a high speed as long as the single crystal of calcium fluoride does not generate cracks.

When maintaining the predetermined high temperature, it is preferable for this temperature to be close to the melting point of the single crystal of fluoride. For example, in the case of a single crystal of calcium fluoride, the desired temperature is about 1300° C. However, by taking into account the durability of the annealing apparatus, it is preferable to maintain the temperature at approximately 1200° C. or less. When the annealing temperature is 900° C. or less, the annealing process is not effective. Therefore, it is preferable to maintain the annealing temperature of 900° C. or more.

The step of cooling is important because it may have great effects on generation of strains (birefringence) in the resultant single crystal of fluoride. It is preferable to control the speed at which the temperature is lowered to be about 5° C./hr or less. Also, it is more preferable to have a phased schedule for the cooling such that the temperature is lowered from the predetermined annealing temperature to a first predetermined temperature with a cooling rate of 1° C./hr or less, for example, and is subsequently lowered to room temperature with a slightly higher rate of cooling, 5° C./hr or less. In either case, the annealed single crystal of fluoride is cooled such that the distribution range of the internal temperature in the single crystal of fluoride is maintained within 5° C. or less.

By conducting the above-described annealing control, the residual stress or strains in the resultant single crystal of fluoride can be reduced.

Examples of single crystals of fluoride that are subjected to the annealing of the present invention are, calcium fluoride, magnesium fluoride, barium fluoride, lithium fluoride, sodium fluoride, and strontium fluoride.

When the annealing method described above is conducted in a process of the manufacturing a single crystal of fluoride, such a process corresponds to a manufacturing method of a single crystal of fluoride according to the present invention. The manufacturing method of a single crystal of fluoride according to the present invention is described in more detail below.

For the case of a single crystal of calcium fluoride used in the ultraviolet range or vacuum ultraviolet range, natural calcium fluoride is not usually used as the raw material. Instead, chemically synthesized materials with a high purity are used.

It is possible to use the raw material in its powder state. However, in this case, there is a great reduction in volume while it is melted. Therefore, a half-fused product or its smashed product (pre-processed product) is usually used. A more preferable fluoride material is preprocessed product in collet or lump form. Such a material can be obtained through a pre-process in which a fluoride material and a scavenger are mixed and melted in a crucible, and the preprocessed product is obtained by gradually cooling them. To manufacture a single crystal of fluoride (for example, a single crystal of calcium fluoride), a crucible filled with the above-mentioned material is placed in a growth apparatus with the inside of the growth apparatus maintained at a vacuum pressure of about $10^{-3}$ Pa to about $10^{-4}$ Pa.

Next, the temperature inside the growth apparatus is raised to the melting point of the single crystal of calcium fluoride or higher (approximately 1370° C. to 1450° C.) and the material inside the crucible is fused. At this time, in order to prevent temporal temperature changes inside the growth apparatus, the temperature is controlled by a constant-power output or high precision PID control.

At the growth stage of the crystal, the material is gradually crystallized from the bottom of the crucible by lowering the crucible at a speed of about 0.1 mm to about 5 mm per hour.

When the material is crystallized up to the top, the crystal growth is completed, and a grown crystal (ingot) is gradually cooled down so that it does not crack. When the temperature inside the growth apparatus is lowered to room temperature, the apparatus is opened to the atmosphere and the ingot is taken out.

The ingot obtained as above is cut into desired sizes or processed, and then the annealing process of the present invention is conducted. In the manufacturing method of a single crystal of fluoride according to the present invention, a surface cleaning process is preferably conducted immediately before the annealing process after the ingot obtained through the crystal growth is cut out and/or processed.

The annealing and manufacturing methods of the present invention are not limited to application to the manufacture of a single crystal of fluoride but are also applicable to a single crystal material and a single crystal member other than fluoride crystals.

The present invention is described in more detail referring to working examples. However, the present invention is not limited to these examples.

WORKING EXAMPLES

An Example Of The Annealing Process With A Surface Cleaning Step And A Deteriorated Layer Removal Process First, single crystals of calcium fluoride to be annealed (external diameter of 250 mm to 300 mm) were prepared. Foreign objects and impurities absorbed or attached to the respective surface of each crystal were removed with an organic mixed solvent of acetone and ethanol to clean the surfaces (surface cleaning process). Next, a container (container for enclosing the products to be annealed), which enclosed a fluorination agent (acidic ammonium fluoride) and the single crystals of calcium fluoride to which a cleaning process was applied, was placed in an airtight container of an annealing apparatus, and the airtight container was sealed. The airtight container was then vacuumed up to a predetermined vacuum level (about $10^{-1}$ Pa or less), and then the vacuuming was stopped (vacuuming process).

By heating the airtight container with heaters arranged at the outside of the airtight container, the temperature inside the airtight container and thus the temperature of the container enclosing the products to be annealed were raised to vaporize the fluorination agent. Accordingly, a fluorine atmosphere was created inside the container (heating process).

Then, the temperature inside the container was maintained at a predetermined temperature (1200° C.) for a predetermined period of time (24 hours) (process for maintaining a high temperature).

Next, by controlling the heaters, the temperature inside the container was gradually lowered, and then the airtight container was opened to the atmosphere (cooling process).

At this point, it was found that due to the annealing atmosphere and the heat during the annealing process, the surfaces of the single crystals of calcium fluoride, which were taken out from the container, were etched and deteriorated layers were formed thereon.

The surfaces of the single crystals of calcium fluoride were ground to remove the deteriorated layers (deteriorated layer removal process).

The transmittance of the obtained single crystals of calcium fluoride were measured. The bulk transmittance (transmittance subtracting the effect of losses due to the surface reflection) was found to be 99% or more at a wavelength of 193 nm.

It is considered that foreign objects and impurities, which cause reduction in transmittance and increase scattering (generation of haze) in the single crystal of calcium fluoride upon annealing the crystal, are attached during cutting and/or rounding processes which are conducted prior to the annealing process. In the present example, these foreign objects and impurities were removed from the surface of the single crystal of calcium fluoride before the annealing.

Accordingly, very high quality single crystals of fluoride having a high transmittance without haze and scattering were obtained.

Also the annealing was conducted without cleaning the surface of the crystal in advance. In this case, foreign objects and impurities on the surface diffuse into the inside of the single crystal of calcium fluoride. Therefore, even though the deteriorated layer was removed after the annealing, the bulk transmittance of such a single crystal of calcium fluoride was found to be 90% or less at 193 nm.

As described above, when a single crystal of calcium fluoride was annealed with the method of the present example, the resultant single crystal of calcium fluoride which is acceptable for use in high-precision optical systems, such as an optical system for photolithography with a wavelength of 250 nm or less (for example, photolithography using KrF or ArF excimer lasers, $F_2$ lasers, and solid-state lasers with non-linear optical crystal) was obtained.

An Example Of The Annealing Method Which Reduces The Distribution Range (Fluctuation) Of The Internal Temperature Of A Single Crystal Of Fluoride FIG. 1 is a schematic cross-sectional view of an annealing apparatus of the present example. The annealing apparatus includes a first container 2 for enclosing single crystals of calcium fluoride 8, an airtight second container I to be sealed and vacuumed after the first container 2 containing the single crystals of calcium fluoride 8 are placed in the inside, and a plurality of heaters 3, 4, and 5, located on the outside of the second container 1. The heaters 3, 4, and 5 can be individually controlled. Also provided in the first container are thermal insulation members 9, 10, and S which prevent thermal conduction from the inside of the first container 2 to the outside of the first container 2.

The thermal insulation members 9 and 10 are multiple plate-shaped members 9 (5 pieces) and 10 (4 pieces) provided on the top portion and the bottom portion, respectively, inside the first container 2. Each member is adapted to cover the cross-section of the container and to be isolated from each other. The plate-shaped members 9 and 10 are made of carbon which has a superior heat ray (infrared) reflection property and a relatively low thermal conductivity. Moreover, as shown in the figure, spaces having a lower thermal conductivity than that of the members 9 and 10 are provided between adjacent members.

The thermal insulation members S are multiple plate-shaped members S (they also function as shelves for placing single crystals of calcium fluoride thereon) arranged such that the surface of each member is parallel (or approximately parallel) to the direction along which the greatest heat transfer from the outside of the first container to the inside of the first container occurs. The thermal insulation members S are also arranged adjacent to the single crystals of calcium fluoride.

The plate-shaped members S are arranged in parallel (or approximately parallel) with the direction along which the greatest heat transfer into the first container occurs. Therefore, the members S hardly affect the heat flow into the first container. Moreover, because the members S are arranged adjacent to the single crystals of calcium fluoride, they prevent heat loss (in particular, the heat loss in the direction perpendicular to the direction of the greatest heat transfer) from the single crystals of calcium fluoride which is subjected to the annealing. As a result, a uniform temperature distribution can be obtained in each of the single crystals of calcium fluoride.

The first container is preferably made of material having a high thermal conductivity, a low heat ray reflectivity, and a melting point equivalent to or higher than that of the single crystal of calcium fluoride. In this example, the first container was made of carbon which has a high thermal conductivity in the direction of the thickness of the container walls and has a low thermal conductivity in the direction of the length of the container walls.

For the plate-shaped members (shelves) S or plate-shaped members 9 and 10 provided close to and above the single crystal of calcium fluoride, carbon, which has a melting point equivalent to or higher than that of the single crystal of calcium fluoride, was used.

In the apparatus of the present example, three separate heaters; top, middle and bottom heaters, were provided at both side portions at the outside of the second container 1, and each heater was individually controlled. Accordingly, the internal temperature distributions in the single crystals of calcium fluoride 8 were made uniform by making the temperature distribution in the second container I uniform. This was done by setting the heating temperatures of heaters 3 and 5, which are located near the top portion and the bottom portion of the container 1 (or second container 1), respectively, where heat losses are relatively easily occur to a higher temperature than that of the middle heater 4. This is effective because the middle heater 4 is close to the center portion of the second container 1 where the heat flow-in is greater than the heat loss and the single crystals of calcium fluoride 8 to be annealed are placed.

When an annealing apparatus has an opening at the top portion of the airtight container for handling crystals, as in the present example, the top portion of the airtight container usually has a greater heat loss, and the temperature near the top portion becomes relatively low. Therefore, by individually controlling the heaters using two circuits, a desirable temperature distribution can be achieved in the airtight container.

When the bottom portion of an airtight container has a mounting surface, the temperature of the bottom portion of the airtight container tends to become low. By reinforcing the insulators, it is possible to prevent the lowering of the temperature at the bottom portion to a certain extent. However, in order to create a more desirable temperature distribution, heaters were individually controlled using three circuits in the present example.

The temperature distribution inside the airtight container was measured using thermocouples 6. It was found that the uniformity in the temperature distribution can be significantly improved over the case in which the thermal insulation members of the present invention are not provided—the isothermal length was roughly doubled, and the difference in temperature at point A and point B in the FIG. 1 was improved from 12° C. to 2° C.

With the annealing apparatus of the present example having the above described structure, it is possible to make the temperature distribution more uniform (the distribution range of the internal temperature in the single crystal of calcium fluoride to be within 5° C. or less) by significantly reducing the differences in temperature inside the second container (and inside the first container) during the annealing. As a result, strain (birefringence) in the resultant single crystal of calcium fluoride was successfully removed. Therefore, a single crystal of calcium fluoride that is acceptable for use in high-precision optical systems was obtained.

As described above, with the present invention, it is possible to obtain a single crystal of fluoride having a high transmittance and low strain without haze inside or deteriorated layers on its surface.

With the present invention, it is possible to obtain a single crystal of fluoride (in particular a single crystal of calcium fluoride with a large diameter) that is acceptable for use in high-precision optical systems, such as optical systems for photolithography at a wavelength of 250 nm or less (for example photolithography using KrF or ArF excimer lasers, $F_2$ lasers, solid-state lasers with nonlinear optical crystals).

It will be apparent to those skilled in the art that various modifications and variations can be made in the method of annealing a single crystal of fluoride and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. An annealing method for a single crystal of fluoride, comprising the steps of:

removing at least one of attached objects and absorbed objects from the surface of the single crystal of fluoride to clean the surface to prepare for annealing to be performed thereafter; and thereafter annealing the single crystal of fluoride, including heating the single crystal of fluoride at a temperature lower than a melting point of the single crystal of fluoride and gradually cooling the heated single crystal of fluoride, wherein the step of annealing includes the steps of:

housing the single crystal of fluoride in an airtight container of an annealing apparatus, including housing the single crystal of fluoride in the airtight container of the annealing apparatus that includes a plurality of individually controllable heaters arranged outside of the container and a plurality of thermal insulation members for preventing heat transfer from the inside of the container to the outside of the container, the thermal insulation members of the annealing apparatus including plate-shaped members arranged in the container;

vacuuming the airtight container until the inside of the airtight container reaches a vacuum pressure;

heating the vacuumed container to the temperature lower than the melting point of the single crystal of fluoride;

maintaining the temperature for a fixed period of time; and gradually lowering the temperature of the container.

2. An annealing method for a single crystal of fluoride, comprising the steps of:

annealing the single crystal of fluoride, including heating the single crystal of fluoride at a temperature lower than a melting point of the single crystal of fluoride and gradually cooling the heated single crystal of fluoride wherein the internal temperature fluctuation in the single crystal of fluoride is controlled to be within about 5° C. during the annealing; and removing a deteriorated layer which is formed on the surface of the single crystal of fluoride during the annealing step.

3. The annealing method according to claim 2, wherein the step of annealing includes the steps of:

housing the single crystal of fluoride in an airtight container of an annealing apparatus;

vacuuming the airtight container until the inside of the airtight container reaches a vacuum pressure;

heating the vacuumed container to the temperature lower than the melting point of the single crystal of fluoride;

maintaining the temperature for a fixed period of time; and gradually lowering the temperature of the container.

4. The annealing method according to claim 3, wherein the step of annealing further includes, between the steps of vacuuming and heating, the step of introducing an inert gas into the container.

5. The annealing method according to claim 4, wherein the step of annealing further includes the step of vacuuming the inert gas from the container.

6. The annealing method according to claim 3, wherein the step of housing includes housing the single crystal of fluoride in the airtight container of the annealing apparatus that includes a plurality of individually controllable heaters arranged outside of the container and a plurality of thermal insulation members for preventing heat transfer from the inside of the container to the outside of the container.

7. The annealing method according to claim 6, wherein each of the thermal insulation members is made of at least one of metal materials, ceramic materials, and single crystals of fluoride materials, the metal materials including molybdenum and stainless steel, and the ceramic materials including carbon, BN, SiC, and SiN.

8. The annealing method according to claim 6, wherein the thermal insulation members of the annealing apparatus include plate-shaped members arranged in the container.

9. An annealing method for a single crystal of fluoride, comprising the steps of:

removing at least one of attached objects and absorbed objects from the surface of the single crystal of fluoride to clean the surface to prepare for annealing to be performed thereafter;

thereafter annealing the single crystal of fluoride, including heating the single crystal of fluoride at a temperature lower than a melting point of the single crystal of fluoride and gradually cooling the heated single crystal of fluoride; and removing a deteriorated layer which is formed on the surface of the single crystal of fluoride during the annealing step.

10. The annealing method according to claim 9, wherein the step of annealing includes the step of controlling the internal temperature fluctuation in the single crystal of fluoride to be within about 5° C. during the annealing.

11. The annealing method according to claim 9, wherein the step of annealing includes the steps of:

housing the single crystal of fluoride in an airtight container of an annealing apparatus;

vacuuming the airtight container until the inside of the airtight container reaches a vacuum pressure;

heating the vacuumed container to the temperature lower than the melting point of the single crystal of fluoride;

maintaining the temperature for a fixed period of time; and gradually lowering the temperature of the container.

12. The annealing method according to claim 11, wherein the step of annealing further includes, between the steps of vacuuming and heating, the step of introducing an inert gas into the container.

13. The annealing method according to claim 12, wherein the step of annealing further includes the step of vacuuming the inert gas from the container.

14. The annealing method according to claim 11, wherein the step of housing includes housing the single crystal of fluoride in the airtight container of the annealing apparatus that includes a plurality of individually controllable heaters arranged outside of the container and a plurality of thermal insulation members for preventing heat transfer from the inside of the container to the outside of the container.

15. The annealing method according to claim 14, wherein each of the thermal insulation members is made of at least one of metal materials, ceramic materials, and single crystals of fluoride materials, the metal materials including molybdenum and stainless steel, and the ceramic materials including carbon, BN, SiC, and SiN.

16. The annealing method according to claim 14 wherein the thermal insulation members of the annealing apparatus include plate-shaped members arranged in the container.

17. A manufacturing method of a high quality single crystal of fluoride, comprising the steps of:

growing a single crystal of fluoride by fusing a fluoride material in a crucible and gradually cooling the fused fluoride material;

annealing the single crystal of fluoride, including heating the single crystal of fluoride at a temperature lower than a melting point of the single crystal of fluoride and gradually cooling the heated single crystal of fluoride, wherein the internal temperature fluctuation in the single crystal of fluoride is controlled to be within about 5° C. during the annealing; and removing a deteriorated layer which is formed on the surface of the single crystal of fluoride during the annealing step.

18. The manufacturing method according to claim 17, further including the steps of mixing a fluoride material with a scavenger in a crucible, and fusing and gradually cooling the mixture to produce a product having one of collet and lump forms, the product being used as the fluoride material in the step of growing the single crystal of fluoride.

19. A manufacturing method of a high quality single crystal of fluoride, comprising the steps of:

growing a single crystal of fluoride by fusing a fluoride material in a crucible and gradually cooling the fused fluoride material;

removing at least one of attached objects and absorbed objects from the surface of the single crystal of fluoride to clean the surface to prepare for annealing to be performed thereafter;

thereafter annealing the single crystal of fluoride, including heating the single crystal of fluoride at a temperature lower than a melting point of the single crystal of fluoride and gradually cooling the heated single crystal of fluoride; and removing a deteriorated layer which is formed on the surface of the single crystal of fluoride during the annealing step.

20. The manufacturing method according to claim 19, further including the steps of mixing a fluoride material with a scavenger in a crucible, and fusing and gradually cooling the mixture to produce a product having one of collet and lump forms, the product being used as the fluoride material in the step of growing the single crystal of fluoride.

21. The annealing method according to claim 2, wherein the single crystal of fluoride is a calcium fluoride crystal.

22. The annealing method according to claim 9, wherein the single crystal of fluoride is a calcium fluoride crystal.

23. The manufacturing method according to claim 17, wherein the single crystal of fluoride is a calcium fluoride crystal.

24. The manufacturing method according to claim 19, wherein the single crystal of fluoride is a calcium fluoride crystal.

25. An annealing method for a single crystal of fluoride, comprising the steps of:

removing at least one of attached objects and absorbed objects from the surface of the single crystal of fluoride to clean the surface to prepare for annealing to be performed thereafter, including applying an organic mixed solvent of acetone and ethanol to the surface of the single crystal of fluoride; and thereafter annealing the single crystal of fluoride, including heating the single crystal of fluoride at a temperature lower than a melting pont of the single crystal of fluoride and gradually cooling the heated single crystal of fluoride.

26. The annealing method according to claim 9, wherein the step of removing the at least one of attached objects and absorbed objects includes applying an organic mixed solvent of acetone and ethanol to a surface of the single crystal of fluoride.

27. A manufacturing method of a high quality single crystal of fluoride, comprising the steps of:

growing a single crystal of fluoride by fusing a fluoride material in a crucible and gradually cooling the fused fluoride material;

removing at least one of attached objects and absorbed objects from the surface of the single crystal of fluoride to clean the surface to prepare for annealing to be performed thereafter, including applying an organic mixed solvent of acetone and ethanol to the surface of the single crystal of fluoride; and thereafter annealing the single crystal of fluoride, including heating the single crystal of fluoride at a temperature lower than a melting point of the single crystal of fluoride and gradually cooling the heated single crystal of fluoride.

28. The manufacturing method according to claim 19, wherein the step of removing the at least one of attached objects and absorbed objects includes applying an organic mixed solvent of acetone and ethanol to a surface of the single crystal of fluoride.

* * * * *